United States Patent [19]

Trutna, Jr. et al.

[11] Patent Number: 5,263,037
[45] Date of Patent: Nov. 16, 1993

[54] OPTICAL OSCILLATOR SWEEPER

[75] Inventors: William R. Trutna, Jr., Atherton; Paul Zorabedian, Mountain View, both of Calif.

[73] Assignee: Hewlett-Packard Company, Palo Alto, Calif.

[21] Appl. No.: 15,663

[22] Filed: Feb. 9, 1993

Related U.S. Application Data

[63] Continuation of Ser. No. 733,552, Jul. 22, 1991, abandoned, which is a continuation-in-part of Ser. No. 561,024, Aug. 1, 1990, Pat. No. 5,140,599.

[51] Int. Cl.$^5$ .............................................. H01S 3/10
[52] U.S. Cl. ........................................ 372/20; 372/13; 372/32; 372/93; 372/102; 372/703
[58] Field of Search ............................ 372/13, 18–20, 372/22–33, 31, 32, 96, 92, 93, 102; 359/285–287

[56] References Cited

U.S. PATENT DOCUMENTS

| | | | |
|---|---|---|---|
| 3,393,955 | 7/1968 | Sterzer | 372/28 |
| 3,714,607 | 1/1973 | Cutler | |
| 4,118,675 | 10/1978 | Ruhn et al. | 372/19 |
| 4,390,247 | 6/1983 | Freyre | 372/700 |
| 4,456,338 | 6/1984 | Gelbart | 359/287 |
| 4,460,250 | 7/1984 | Freyre et al. | 359/287 |
| 4,502,144 | 2/1985 | Suhre | 372/23 |
| 4,512,021 | 4/1985 | Chenawsky et al. | 372/20 |
| 4,586,184 | 4/1986 | Hess | 359/287 |
| 4,727,552 | 2/1988 | Porte et al. | 372/20 |
| 4,736,382 | 4/1988 | O'Meara | 372/28 |
| 4,852,106 | 7/1985 | Hino et al. | 359/287 |
| 4,942,583 | 7/1990 | Nazarathy et al. | |
| 4,945,539 | 7/1990 | Bagshaw et al. | 372/13 |
| 5,077,746 | 12/1991 | Ewart | 372/19 |
| 5,105,304 | 4/1992 | Tanaka et al. | 359/287 |

OTHER PUBLICATIONS

G. Coquin et al., "Single and Multiple Wavelength Operation of Acoustooptically Tuned Semiconductor Lasers at 1,3mum". IEEE Journal of Quantum Electronics, vol. 25, No. 6, Jun., 1989, New York, pp. 1575–1579.

Patent Abstracts of Japan, vol. 12, No. 13 (E-573) Jan. 14, 1988 & JP-A-62 172 777 (Yokagawa) *abstract*.
Patent Abstracts of Japan, vol. 12, No. 329 (P-754) Sep., 1988 & JP-A-63 092 917 (Fujitsu) *abstract*.
F. V. Kowalski et al., "Optical Pulse Generation with a Frequency Shifted Feedback Laser", Applied Physics Letters, vol. 53, No. 9 Aug. 29, 1988, New York, pp. 734–736.
J. Mellis et al., "Miniature Packaged External-Cavity Semiconductor Laser with 50 GHz Continuous Electrical Tuning Range," Electronic Letters, 24(16):988–989 (Apr. 22, 1988).
J. O'Gorman et al., "Feedback Induced instabilities in External Cavity Injection Lasers," Electronic Letters, 25:114–115 (Nov. 21, 1988).
"External-grating-cavity Laser Yields Gbit Modulation, subMHz Linewidth," and Organic Nonlinear Polymers Make Fiberoptic Devices, Laser Focus World, p. 143 (May, 1989).
Y. Ohmachi et al., "LiNbO$_3$ TE-TM Mode Converter Using Collinear Acoustooptoc Interaction," IEEE Journal of Quantum Electronics, QE13(2):43–46 (Feb., 1977).
V. P. Hinkov et al., "Collinear Acoustooptical TM-TE Mode Conversion in Proton Exchanged Ti:LiNbO$_3$ Waveguide Structures," Journal of Lightwave Technology, 6(6):903–908 (Jun. 1988).
J. Wittmann et al., "Narrow-linewidth Laser with a

(List continued on next page.)

Primary Examiner—Léon Scott, Jr.

[57] ABSTRACT

An electrically tunable optical oscillator. An acoustooptically tunable filter is located in a feedback path of an optical oscillator. The filter non-collinearly diffracts the light signal to selectively tune the oscillator. In one embodiment the light signal passes twice through a single filter in a single transit around the feedback path. In another embodiment the light passes through a pair of filters which are arranged such that any frequency shift created by one is cancelled by the other.

5 Claims, 7 Drawing Sheets

OTHER PUBLICATIONS

Prism Grating/Grin Rod Lens Combination Serving as External Cavity," *Electronics Letters*, 23(10:524–525) (Jan. 26, 1987).

A. A. Oliner, "Waveguides for Acoustic Surface Waves: A Review," *Proceedings of the IEEE*, 6415:615–627 (May, 1976).

R. V. Schmidt et al., "Acoustooptic Bragg Deflection in LiNbO$_3$ Ti-Diffused Waveguides," *IEEE Journal of Quantum Electronics*, pp. 57–59 (Aug. 19, 1974).

D. V. Petrov et al., "Optical Parameters of Single-mode LiNbO$_3$:Ti Waveguides for Collinear Acoutooptic Interaction," *Sov. J. Quantum Electron.*, 15(1):58–60 (Jan., 1985).

L. N. Binh et al., "Optimisation of a Collinear Acoutooptic TE$_m$-TE$_n$ Mode Converter LiNbO$_3$," *IEEE Proc.*, 127(6):323–329 (Dec., 1980).

K. Yamanouchi et al., "TE-TM Mode Conversion by Interaction between Elastic Surface Waves and a Laser Beam on a Metal-diffused Optical Waveguide," *Appl. Phys. Letters*, 28(2):75–77 (Jan. 15, 1976).

L. N. Binh et al., "A Wide-band Acousti/optic TE-TM Mode Converter Using a Doubly Confined Structure," *IEEE Journal of Quantum Electronics*, QE16(9):964–971 (Sep., 1980).

W. Streifer et al., "Analysis of a Dye Laser Tuned by Acousto-optic Filter," *Applied Physics Letters*, 17(8):335–337 (Oct. 15, 1970).

D. J. Taylor et al., "Electronic Tuning of a Dye Laser Using the Acousto-optic Filter," *Applied Physics Letters*, 19(8):269–271 (Oct. 15, 1971).

S. E. Harris et al., "Acousto-optic Tunable Filter," *Journal of the Optical Society of America*, 59(6):744–747 (Jun. 1969).

S. E. Harris et al., "CaMoO$_4$ Electronically Tunable Optical Filter", *Applied Physics Letters*, (17(5):223–225 (Sep. 1, 1970).

G. A. Coquin et al., "Electronically Tunable External-cavity Semiconductor Laser," *Electronics Letters*, 24(10):599–600 (May 12, 1988).

S. E. Harris et al., "Electronically Tunable Acousto-optic Filter," *Applied Physics Letters*, 15(10):325–326 (Nov. 15, 1969).

T. Yano et al., "New Noncollinear Acousto-optic Tunable Filter using Birefringence in Paratellurite," *Appli. Phys. Letters*, 24(6):256–258 (Mar. 15, 1974).

O. I. Kotov et al., "Semiconductor Ring Laser with an External Resonator," *Sov. Phys. Tech. Phys.*, 25(7):836–839 (Jul., 1980).

P. A. Mishnaevskii et al., "Effect of Bends and Twists on the Attenuation in a Multimode Waveguide," *Sov Phys. Tech. Phys*, 25(7):839, (Jul., 1980).

A. P. Bogatov et al., "CW Operation of an Injection Ring Laser," *Sov. Tech. Phys. Lett.*, 8(7)346–347 (Jul. 1982).

G. Cognin et al., "Single-and Multiple-Wavelength Operation of Acoustroptically Tuned Semiconductor Laser at 1.3um", *IEEE Journal of Quantum Electronics*, Qe25(6):1575–1579 (Jun., 1989).

$$k = \frac{4}{\left(\frac{W_0}{W_2} + \frac{W_2}{W_0}\right)^2 + \left(\frac{\pi W_0 W_2}{\lambda}\right)^2 \left(\frac{1}{R_2} - \frac{1}{R_0}\right)^2} \quad \text{(KOGELNIK)}$$

FIG._8.

OPTICAL OSCILLATOR SWEEPER

CROSS REFERENCE TO RELATED APPLICATION

This is a continuation of copending application Ser. No. 07/733,552 filed on July 22, 1991, now abandoned which is a continuation-in-part of U.S. Pat. application Ser. No. 561024 filed on Aug. 1, 1990 now U.S Pat. No. 5,140,599 entitled "Optical Oscillator Sweeper."

BACKGROUND OF THE INVENTION

This invention relates in general to optical oscillators and in particular, to an optical oscillator whose frequency may be tuned so as to sweep across a predetermined bandwidth.

The use of optical fiber communications has expanded rapidly in recent years and has replaced microwave communications in many applications. For this reason much research and development have been performed in optical communications, particularly heterodyne communications systems employing optical heterodyne receivers. When an optical heterodyne receiver is tuned, a local oscillator is actually tuned instead of a filter. It is thus desirable to develop continuously swept optical oscillators which may be used in optical heterodyne receivers.

In microwave communication, microwave test and measurement instruments form an important part of the communications equipment. These test and measurement instruments include, for example, network analyzers and spectrum analyzers. The heart of both these instruments is a continuously swept oscillator. With the advent of optical communications, it is important to develop the optical analogs of the microwave network analyzers and spectrum analyzers. It is therefore desirable to provide a continuously swept optical oscillator. Other important microwave instruments containing tuneable oscillators are microwave synthesizers (accurate tuneable oscillators) and microwave sweepers (rapidly swept oscillators). Again it will be desirable to develop continuously swept optical oscillators which may be used as optical analogs of these instruments.

From the above, it is evident that it will be desirable to provide optical oscillator sweepers which may be used in the above-described optical instruments, including the heterodyne receiver, network analyzer, spectrum analyzer, synthesizers and sweepers.

For a brief review of various optical fiber communications schemes, see the article "Ultimate Performance of Heterodyne/Coherent Optical Fiber Communications," by T. Okoshi, *Journal of Lightwave Technology*, Vol. LT-4, No. 10, pp. 1556-1562 (Oct. 1986).

In the context of an optical heterodyne receiver, it is possible for the local optical oscillator to be tuned in discrete steps as long as the step size is precisely synchronized to the channel spacing. For example, discretely tunable external cavity lasers (ECL) utilizing semiconductor lasers and acoustooptic tunable filters (AOTFs) in linear feedback configurations have been reported by Coquin, G.A. and Cheung, K.W., in "Electronically tunable external cavity semiconductor laser," *Electron. Lett.*, Vol. 24, pp. 599-600, 1988, and by Coquin et al. in "Single- and Multiple-Wavelength Operation of Acoustooptically Tuned Semiconductor Lasers at 1.3 μm," *IEEE Journal of Quantum Electronics*, Vol. 25, No. 6, pp. 1575-1579 (June 1989).

Two problems arise, however, in designing such tuneable optical oscillators. First, the combination of too much residual reflectivity from the anti-reflection (AR) coated laser facet and too wide an optical bandwidth for the AOTFs can prevent the optical oscillator from tuning at the external cavity frequency modes. The optical wavelengths that can be accessed may be restricted to the residual Fabry-Perot (F-P) modes of the semiconductor chip cavity, because when the AOTF is tuned in between the residual chip F-P modes, it has insufficient loss selectivity to overcome the gain maxima caused by constructive interference between the chip facets.

Second, even if the residual F-P modes of the semiconductor chip cavity did not prevent tuning to the external cavity modes, selective tuning between the discrete external cavity modes can be difficult. With this and other problems in mind, continuously tuned optical oscillators have been proposed. One such oscillator is proposed by Favre et al. in "External-Cavity Semiconductor Laser with 15nm Continuous Tuning Range," *Electronics Letters*, Vol. 22, No. 15, July 17, 1986, pp. 795-796. The laser proposed by Favre requires a grating to be continuously rotated and moved away or towards an amplifier chip in order to continuously tune the frequency of the laser. As explained in detail below, it is difficult to achieve the needed mechanical precision using mechanical tuning devices. It is therefore desirable to provide an improved continuously swept optical oscillator with improved characteristics.

SUMMARY OF THE INVENTION

In the above-referenced continuously tuneable grating external-cavity laser described by Favre et al., the grating is moved continuously away from or towards an amplifier chip generating light while at the same time the grating is rotated continuously as well. As explained in detail below, the relative translational motion between the light-generating amplifier chip and the grating causes a Doppler shift in the frequency of the laser. Since the Doppler shift occurs every cavity round trip, the laser frequency continuously increases or decreases depending on the direction of grating motion. The rotational motion of the grating causes the passband of the filter formed by the grating together with the amplifier chip to follow the shifting frequency of the laser caused by the Doppler shift.

One aspect of the invention is based on the observation that, instead of using a mechanical grating to cause the Doppler shift, the frequency shift and therefore tuning of the laser may be achieved by using a plurality of acoustooptic tuneable filters (AOTFs). As described in detail below, an AOTF may be incorporated as the tuning element of an external cavity laser. The AOTF consists of a crystal in which an optical beam and a sinusoidal traveling acoustic wave interact via the photoelastic effect. The acoustic wave alters the refractive index of the crystal with a period equal to the acoustic wavelength forming a diffraction grating in the crystal. Diffraction of light from the grating is used to filter the incident light. Since the acoustic wave is moving at the velocity of sound, the diffracted light is Doppler shifted. It is therefore possible to tune the oscillator by controlling the Doppler shift in the optical frequency.

Since the Dopper shift caused by a single AOTF in its presently available commercial form is too big to be useful, a plurality of AOTFs are used for this aspect of the invention, each causing a Doppler shift, where the Doppler shifts caused by the plurality of AOTFs largely cancel each other, leaving a remnant Doppler shift which is used for tuning the oscillator.

An optical oscillator, utilizing these aspects of the invention, comprises an oscillator means for providing light of one or more longitudinal modes within a passband. The bandwidth of the passband is within a predetermined gain bandwidth of the oscillator means. The oscillator means includes an optical amplifier for providing light and feedback means for feeding light from the amplifier back to the amplifier in the feedback path to cause light emission in the longitudinal modes. The optical oscillator also includes a plurality of AOTFs in the feedback path, each filter causing a Doppler shift of the longitudinal mode frequencies. The optical oscillator further includes means for driving the filters at different frequencies such that the Doppler shifts caused by said plurality of filters do not entirely cancel. The net Doppler shift caused by said plurality of filters is then used to continuously tune the frequency of the laser. The filters are such that the net Doppler shift is continuously tuned to cause the longitudinal modes to sweep the predetermined gain bandwidth and to cause the passband bandwidth to follow the sweeping modes in order to prevent mode hopping.

In the preferred embodiment, the oscillator further comprises a driving means for driving the filters at different frequencies so that the Doppler shifts caused by the filters do not cancel. The driving means is such that the driving frequencies of the filters are continuously adjustable to cause the longitudinal modes to sweep the predetermined gain bandwidth and to cause the passband bandwidth to follow the sweeping modes in order to prevent mode hopping.

Further, as discussed previously, one of the problems encountered in linear feedback AOTF-ECLs is that the optical wavelengths that can be accessed may be restricted to the residual F-P modes of the semiconductor chip cavity. As explained, this is because when the AOTF is tuned in between the residual chip F-P modes, it may have insufficient loss selectivity to overcome the gain maxima caused by constructive interference between the chip facets.

Thus, another aspect of the invention is based on the observation that, instead of using a linear feedback configuration, the AOTF-ECL could be configured in a ring feedback path. As described in detail below, the ring configuration enhances loss selectivity in order to overcome the gain maxima caused by constructive interference between the chip facets.

An optical oscillator, utilizing this aspect of the invention includes an amplifier means for receiving a light signal and generating in response to it, an amplified light signal of a predetermined frequency band. The amplifier means has two substantially planar facets through which light passes into and out of it. Each facet has an anti-reflective coating deposited on it which allows light to substantially pass through the facet and suppresses its reflection back from the facet. The amplifier means further includes an internal cavity which is defined between the two facets, and the internal cavity resonates light at a first plurality of longitudinal frequency modes.

The optical oscillator further comprises a feedback means for receiving the light signal passing through one of the two facets, modifying the light signal, and beaming the modified light signal onto the other of the two facets. The feedback means thus defines a feedback path over which the light travels from one facet to the other facet. The feedback path, which is external to the amplifier means, further defines an external cavity between the two facets, and the external cavity resonates light at a second plurality of longitudinal frequency modes. The feedback means further includes an acoustooptical tunable filter which non-collinearly diffracts the light. The acoustooptical tunable filter has an input and a pass band, and the pass band has a center frequency which is tunable in response to the input within a predetermined range. The feedback means is such that it causes the modified light signal to be selectively tuned by the filter input to one of the frequency modes of the second plurality of longitudinal frequency modes within the predetermined frequency band by suppressing the light generated at the first plurality of longitudinal frequency modes.

DETAILED DESCRIPTION OF THE INVENTION

First a general background of a simple optical oscillator will be described. This is followed by a discussion of a grating tuned semiconductor laser, and then the invention, which achieves continuous tuning using AOTFs, will be discussed.

Simple Optical Resonator Modes

A laser is an optical oscillator. All oscillators require an amplifier and feedback. In a laser, feedback may be provided by an optical resonator, which in its simplest form includes two mirrors arranged so that light reflects back and forth between the mirrors. It is a basic property of such a resonator imposed by the requirement that the phase of the optical field be continuous after one round trip, that there are a discrete set of resonant optical frequencies. The resonant frequencies are equally spaced by an interval $c/(2nL)$, where c is the speed of light, n is the index of refraction of the medium between the mirrors, and L is the cavity length. In the case of the optical resonator employing two mirrors, the cavity length L is the distance between the mirrors. Each of these resonant frequencies is referred to as a longitudinal mode of the resonator. The mode can be specified by an integer q and the frequency of the qth mode is:

$$f_q = q \frac{c}{2nL} \qquad (1)$$

Physically, the mode number q is the number of standing waves (one half wavelength apart) between the two mirrors.

The laser amplifier can take many very different forms. While aspects of the invention are applicable to many kinds of optical amplifiers, the semiconductor optical amplifier is of particular interest. Therefore, while the amplifier discussed below will be referred to as semiconductor amplifiers, it will be understood that other types of optical amplifiers may also be used and are within the scope of the invention.

In the semiconductor amplifier, optical amplification is caused by optically stimulated recombination of holes and electrons in a pn junction. The emitted light has photon energy close to the bandgap energy, but there is a finite spread in photon energy, and therefore, in photon frequency. For example, if the photon wavelength of a laser used is within the range of 1.3 micrometer to 1.5 micrometer, the frequencies of the photons emitted by the laser will range from 230THz to 200THz. The gain bandwidth is typically 20 THz, which is equal to 20,000 GHz.

Figure 2:
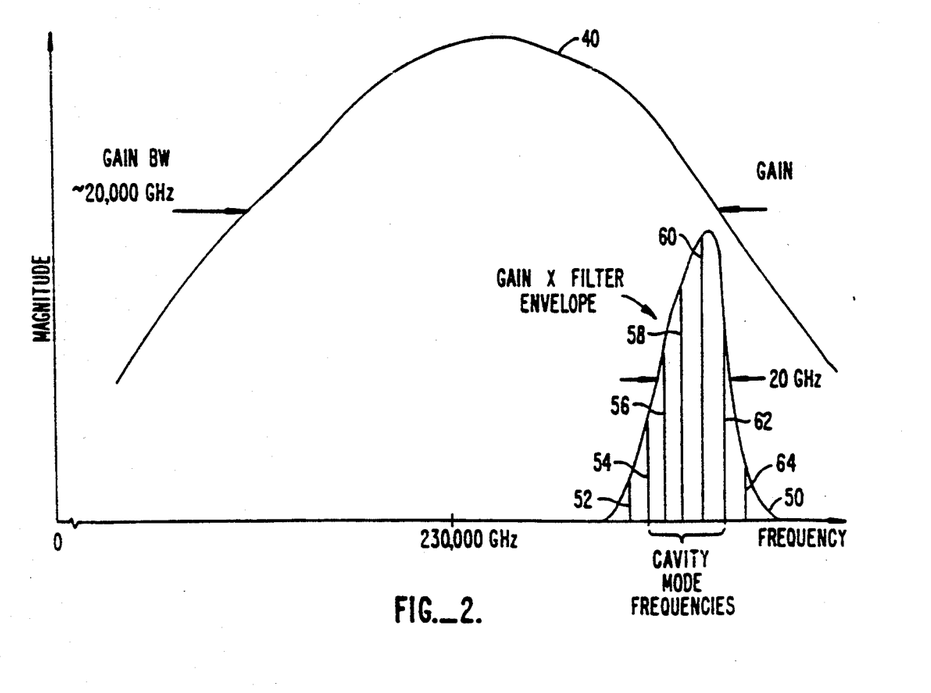
FIG. 2 is a graphical illustration, not drawn to scale, of the spectral features of tuneable lasers to illustrate aspect of the invention.

Additionally, an optical waveguide is also formed in the material to confine the optical beam to the small amplifying region near the pn junction. The two mirror optical cavity is formed by the cleaved mirror facets at either end of the semiconductor chip. These mirrors are typically 0.25 mm apart resulting in a mode frequency spacing of about 175GHz. Since the mode spacing is much smaller than the gain bandwidth, it is possible for several modes to oscillate simultaneously, and in general this happens. This is illustrated in FIG. 2 (not drawn to scale), where the modes are shown as vertical lines 10, 12, 14, 16, under envelope 40. The cleaved mirror reflectivity is frequency independent and therefore, the modes with the highest gain oscillate.

Grating Tuned Semiconductor Laser

In order to tune and to control the wavelength of a semiconductor laser, it is necessary to control the feedback wavelength. One way of doing this is to form an external cavity that contains a wavelength selective filter such as the one in FIG. 1. In this configuration, one facet 12 of the laser chip 10 is anti-reflection (AR) coated to spoil the facet reflectivity. The light from this facet is collimated by a lens 14 and illuminates a planar diffraction grating 16 in the Littrow configuration. The grating diffracts the incident light beam at angles that depend on wavelength.

Figure 1:
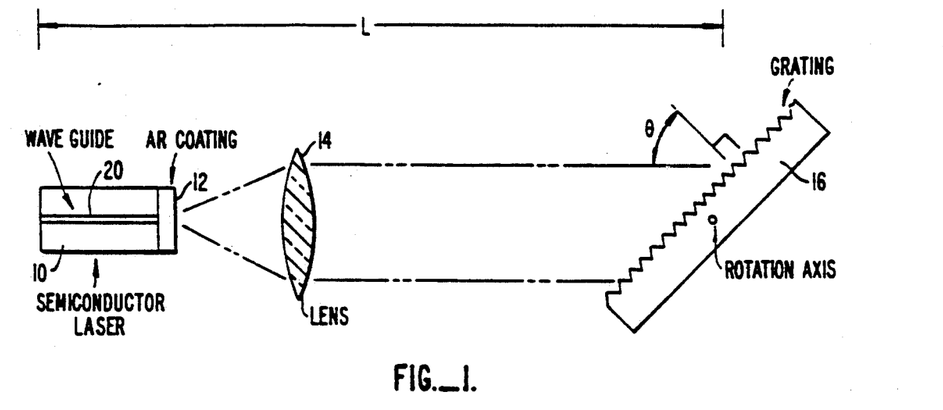
FIG. 1 is a schematic circuit diagram of a continuously tuneable grating external-cavity laser to illustrate a conventional optical oscillator sweeper.

In the configuration of FIG. 1, a portion of the light emitted by laser 10 is focused by lens 14 onto a grating 16. Grating 16 diffracts the light and a portion of the diffracted light is focused by lens 14 to re-enter waveguide 20. Such portion of the light fed back to the laser induces emission of light within an envelope 50 of FIG. 2, and restricts light emission to certain longitudinal modes 52-64. Grating 16 and laser 10 therefore form an external cavity laser where the permissible longitudinal modes are restricted to modes 52-64 and any modes 10-16 which fall within the passband 50 as shown in FIG. 2. Note that in FIG. 2, for illustrative purposes, the passband 50 and frequency modes 52-64 and 10-16 have not been drawn to scale.

In Littrow, the wavelength or frequency that is retroreflected is:

$$\lambda = 2d\sin\theta \text{ OR } \nu = \frac{c}{2d\sin\theta} \qquad (2)$$

where d= the distance between grating rulings
$\theta$ = the grating angle as sketched in FIG. 1 Other wavelengths are diffracted either above (shorter wavelengths) or below (longer wavelengths) the incident beam. When the returning beam is imaged onto the laser waveguide 20, only the Littrow wavelength of equation 2 is precisely imaged and coupled into the waveguide. The images of other wavelengths are displaced. Once the displacement is greater than a beam diameter, there is no more feedback into the amplifier. The bandwidth of this grating filter is calculated in many freshman physics textbooks and is given by:

$$\frac{\Delta\lambda}{\lambda} = \frac{\Delta\nu}{\nu} = \frac{1}{N} \qquad (3)$$

where
$\Delta\lambda$ = the wavelength bandwidth
$\lambda$ = the center wavelength
$\Delta\gamma$ = the frequency bandwidth
$\gamma$ = the center frequency
N= the number of grating lines illuminated by the incident optical beam In many tuneable external cavity lasers (ECLs), the filter bandpass may be about 20GHz, the mode spacing of the laser about 2GHz and the amplifier gain bandwidth about 20,000GHz. These characteristics are sketched together in FIG. 2. In reference to FIG. 2, line 40 is a plot of the overall gain of the semiconductor laser 10 of FIG. 1. As shown in FIG. 2, the overall gain curve 40 has a bandwidth of about 20,000GHz. In other words, a stand-alone semiconductor laser 10 will emit light having a bandwidth shown in FIG. 2. Light emission by laser 10 is caused by recombination of electrons and holes, causing light emission at or near the band gap energy of the active region material of the laser. Thus if laser 10 is used as a stand-alone device without any feedback, it will emit light having a bandwidth shown in FIG. 2.

The net gain per cavity round trip is the product of the amplifier gain and the filter loss as are sketched in FIG. 2. With proper filtering and tuning, only the cavity mode within the filter bandpass with the highest gain will oscillate. Thus, the oscillating mode can be selected by tuning the filter, which is accomplished by rotating the grating in accordance with equation 2. This is the basic principle of the grating tuned ECL.

Continuous Tuning of the Grating Cavity

As pointed out in the previous section, the ECL frequency is determined by two factors, the cavity mode frequencies and the filter bandpass frequency, and the oscillating mode is selected by the filter frequency (grating angle in equation 2).

As the frequency of the oscillating mode is pulled off the peak filter transmission frequency, its net gain decreases. At the same time, the frequency of an adjacent mode is moving toward the filter peak with increasing net gain. At the gain crossover frequency, the mode hops.

Changing the cavity length alone will cause the ECL frequency to periodically hop from mode to mode. This occurs because the comb of equally spaced cavity modes are scanned across the filter bandpass. As grating 16 is moved away from laser 10, this increases the magnitude of the cavity length L in equation 1, causing a corresponding decrease in the frequencies of the longitudinal modes 52–64 shown in FIG. 2. In other words, the permissible longitudinal modes 52–64 are all shifted in frequency towards the origin in FIG. 2. If the grating 16 is moved without any rotation, envelope 50 will remain stationary. If longitudinal mode 60 is the dominant mode having the highest amplitude amongst the modes before grating 16 is moved, the emission in mode 60 will reduce in amplitude when grating 16 is moved away from laser 10, while light emission in mode 62 will increase in amplitude. At a certain point in time, the amplitudes of longitudinal modes 60 and 62 will be equal; thereafter, mode 62 will become the dominant mode having the highest amplitude. This is known as mode hopping where the longitudinal mode of a certain frequency with the largest amplitude hops from one to another. Thus the laser frequency periodically hops with changing cavity length, but stays within one longitudinal mode spacing of the filter frequency. When an oscillator such as that in FIG. 1 is used in a heterodyne receiver, mode hopping causes the reception frequency of the heterodyne receiver to also hop from one frequency to another, which is undesirable.

Likewise, rotating the grating to tune the filter frequency also causes the laser to periodically hop modes. In this case, the longitudinal cavity modes remain fixed in frequency and the filter envelope 50 scans across the comb of modes in FIG. 2. As the filter peak transmission moves from mode to mode the laser jumps in frequency.

Since rotating the grating translates the filter frequency and changing the cavity length changes the frequency of the qth longitudinal mode, it is possible to tune the laser without mode hopping if both cavity length and grating angle are tuned in a coordinated fashion. In other words, the principle of mode-hop-free tuning is based on the idea of simultaneous tuning of cavity modes and the filter frequency so that one mode always remains at the peak filter transmission frequency. This is the idea outlined in the reference by Favre et al. entitled "External Cavity Semiconductor Laser with 15nm Continuous Tuning," *Electronics Letters*, Vol. 22 (1986). *Continuous Tuning Using AOTF.* It is difficult to mechanically control the rotational and translational motions simultaneously and accurately to achieve continuous tuning without mode hopping. Therefore, it is desirable to provide other improved systems which are easier to control.

The invention described herein is a novel concept in which continuous tuning is accomplished electronically with no moving parts. In the electronically tuned laser, the grating filter has been replaced by one or more acoustooptic tuneable filters (AOTFs). The AOTF based cavity will certainly tune faster and it might lead to a smaller, cheaper and more rugged laser than the mechanically tuned implementation described above.

Typically, AOTFs are fabricated using birefringent crystals such as $LiNbO_3$. The AOTF relies on a diffraction grating generated by a sinusoidal traveling acoustic wave launched collinearly with the optical beam to make an optical filter. Rather than diffract the light into different angles like the ruled grating, the AOTF diffracts the filtered wavelength from one linear polarization into the orthogonal polarization. A polarizer is then used to select the filtered light. One feature that the AOTF shares with the conventional grating is that its resolution also depends only on the number of grating lines illuminated (equation 3).

In one particular implementation of an AOTF, a surface acoustic wave is generated at one point on the surface of a birefringent crystal, where the acoustic surface wave propagates along the surface to a second point on the crystal surface where the surface wave is dissipated or absorbed. The traveling acoustic wave changes the index of refraction of the crystal. Therefore, if light also propagates through the same crystal, the periodic changes in the index of refraction in the crystal causes light diffraction. Since a traveling acoustic wave sets up a periodic pattern of variation in the index of refraction, the effect of the acoustic wave on light propagation is similar to that of the grating of FIG. 1. In the case of the moving grating, the relative motion between the amplifier and the grating causes a Doppler shift in the lasing optical frequency of the laser. In the case of the AOTF, the pattern of varying index of refraction moving relative to the optical amplifier causes a similar Doppler shift in the laser frequency. The distance propagated by the traveling acoustic wave is known as the acoustic interaction length. The longer the acoustic interaction length, the greater the number of patterns of varying index of refraction encountered by the propagating light and the narrower the filter bandpass. Therefore, in this sense, the acoustic interaction length has the same effect as the number of grating lines illuminated in equation 3.

In this case the line spacing is equal to the acoustic wavelength, so the filter bandpass is inversely proportional to the acoustic interaction length. In addition, the filter optical peak wavelength or frequency is:

$$\lambda = \frac{v_a \Delta \beta}{f_a} \quad \text{OR} \quad \nu = \frac{cf_a}{v_a \Delta \beta} \quad (4)$$

where $v_a$ = the acoustic velocity
$\Delta \beta$ = the difference in the extraordinary and the ordinary index of refraction in the crystal
$f_a$ = the frequency of the acoustic wave
$c$ = the velocity of light in vacuum AOTFs are typically driven by electronic devices, where the frequency of the propagating acoustic surface wave may be changed by changing the electronic drive frequency. Thus filter tuning is accomplished by changing the electronic drive frequency.

As discussed above by analogy to the tunable grating external cavity laser, another important feature of the AOTF is that the filtered light is Doppler shifted as a consequence of its diffraction from the "grating" (formed by the pattern of varying index of refraction) which is moving at the velocity of sound. Where the acoustic wave is traveling in the same or opposite direction to that of the laser, the magnitude of the Doppler shift is equal to the acoustic wave frequency. The sign of the Doppler shift depends on the polarization of the input beam and the direction of the acoustic wave.

Because of the AOTF Doppler shift, simply replacing the diffraction grating filter in an ECL with an AOTF changes the behavior of the laser significantly. W. Streiffer and J. Whinnery, *Applied Physics Letters*, Vol. 17, pp. 335-337 (1970), showed that the Doppler shift leads to an undesirable spectral broadening of the laser. One solution to the problem is to place a second AOTF inside the laser resonator to cancel the Doppler shift imposed by the first AOTF. In this case, the longitudinal modes of the AOTF cavity are the same as the conventional two mirror cavity. Several authors have reported on cavity designs of this type.

On the other hand, according to the invention, the Doppler shift may be exploited to tune the longitudinal modes of the laser. This will replace the cavity length adjustment that was made in the continuously tuned grating cavity described above.

To better understand how this works, consider again the grating tuned cavity of FIG. 1. Suppose that the laser length is increased by an increment dL that is small compared to the cavity length L. In addition, suppose that the motion is made at constant velocity v. Using equation 1, the tuning rate of the qth longitudinal mode is:

$$\frac{df_q}{dt} = \frac{df_q}{dL} \times \frac{dL}{dt} \quad (5)$$

$$= \frac{-qc}{2nL^2} \cdot v$$

$$= -f_q \cdot \frac{v}{L}$$

Thus the laser frequency changes at a constant rate proportional to the grating velocity.

The mode tuning rate can also be calculated using an alternative viewpoint. Since the grating is moving, the light that is reflected from it is Doppler shifted. If frequency $f_q$ is incident on the grating moving at velocity away at velocity v, then the frequency of the reflected beam is:

$$f_q' \approx f_q[1 - 2nv/c]$$

The frequency change on reflection is:

$$\Delta f = f_q' - f_q = (-2nv/c)f_q$$

In addition, assume that the time interval required for light to make a round trip in the cavity is:

$$T = 2nL/c$$

Since the frequency is shifted on each round trip, the rate of change in laser frequency is:

$$\frac{df_q}{dt} \approx \frac{\Delta f}{T} = -f_q \cdot \frac{v}{L}$$

This is the same answer that was calculated directly from equation 1. The point is that translating the grating or mirror in a conventional cavity tunes the laser longitudinal modes by means of a Doppler shift from the moving mirror or grating. Any other means of creating a Doppler shift within the cavity will do the same thing. The AOTF is one such means.

Figure 3A:
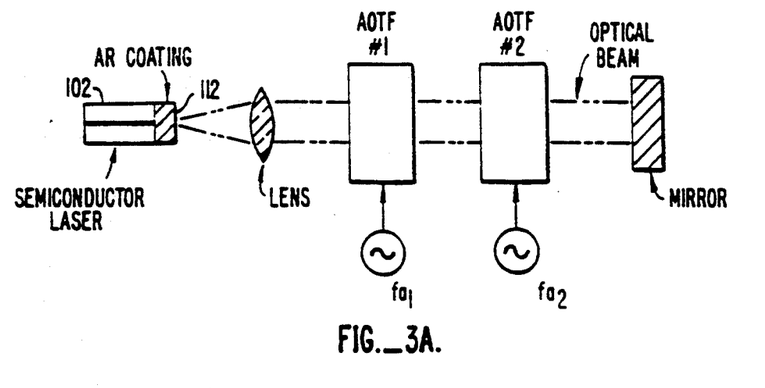
FIGS. 3A-3C are schematic diagrams of three optical oscillator sweepers employing AOTFs to illustrate aspect of the invention.
Figure 3B:
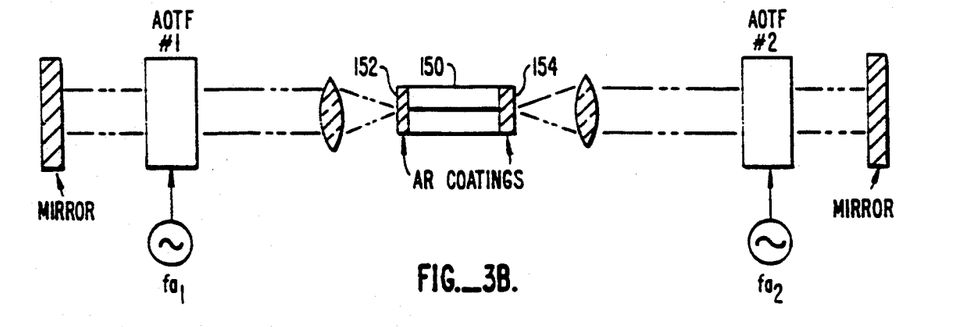
Figure 3C:
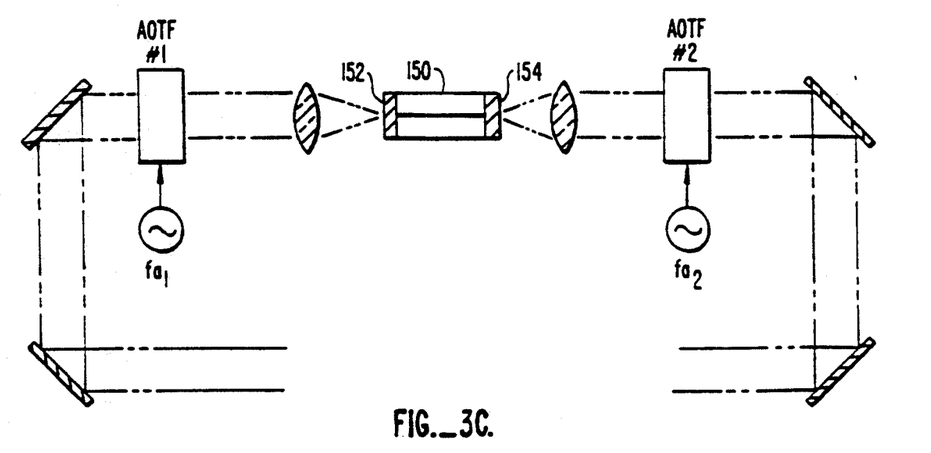

There are several possible embodiments of the continuously tuned AOTF laser sketched in FIG. 3. In all cases there are two AOTFs in series. Using only one AOTF also creates a Doppler shift in the laser frequency; however, with the presently available AOTFs, the amount of frequency shift using only one AOTF is too great to be useful. For this reason, two or more AOTFs are generally used. Instead of exactly canceling the Doppler shift by driving the devices at exactly the same frequency, according to one aspect of this invention, they are driven at slightly different acoustic frequencies, $f_{a1}$ and $f_{a2}$. As stated above in equation 4, the optical bandpasses of the filters will also be slightly offset, but as long as $f_{a1}$ and $f_{a2}$ are closely spaced, the bandpass detuning will not be significant.

There are two general classes of AOTF cavities: linear and ring. In the linear cavities, the optical beam passes through the AOTFs twice on one cavity round trip. In this case the net change in optical frequency per round trip due to the Doppler shift is $2(f_{a1} - f_{a2})$. If the cavity round trip time is T, then the model chirp rate is:

$$dv/dt = 2(f_{a1} - f_{a2})/T$$

In ring cavities, the beam passes through the AOTFs only once per round trip. Thus the factor of "2" appearing in the above equation should therefore be dropped.

If the frequencies $f_{a1}$ and $f_{a2}$ are held constant, but different, the mode will soon tune outside the filter bandwidth. This is the same thing as what happens when the grating angle is fixed and the grating is translated in the grating tuned ECL. In both cases mode hopping occurs. In order for the AOTF to tune continuously, the bandpass of the AOTFs must be tuned to track the chirping mode. Again, this is analogous to the continuously tuned grating cavity. In the grating tuned laser, the grating angle and the grating position must be simultaneously adjusted for continuous tuning. In the AOTF tuned cavity, the absolute drive frequencies for the two AOTFs must be simultaneously adjusted for continuous tuning.

As an example, consider certain AOTF devices constructed for an experiment. These devices are designed for the 1300nm laser wavelength region. We want to sweep the laser approximately 100nm. The AOTF filter bandpass is centered at 1300nm when they are driven at approximately 200MHz. If the optical round trip time is 1 nanosecond and $2(f_{a1} - f_{a2})$ is 10kHz, then the chirp rate is 10,000GHz per second, which is approximately 56nm per second. Thus we can scan the entire 100nm tuning range in less than two seconds.

FIGS. 3A-3C are schematic diagrams of three optical oscillator sweepers employing AOTFs to illustrate aspects of the invention. As described above, in the sweepers of both FIGS. 3A, 3B, in the feedback path, the light propagates through AOTF1, AOTF2 twice, whereas in the ring-type configuration of FIG. 3C, the light propagates through the two AOTFs only once. In addition, another difference is worth noting. In FIG. 3A, laser 102 needs to be coated only on one side by anti-reflection coating 112. As is known, anti-reflection coatings are not perfect so that some residual refraction will always occur at such coating, causing spurious oscillations or discontinuous tuning in laser 102. For this reason, it is preferable to employ anti-reflection coatings on both sides of the laser such as coatings 152, 154 in the sweepers of FIGS. 3B, 3C. Where both ends of the laser have such coatings, the Q of the spurious cavity in laser 150 is reduced. For this reason both ends of laser 150 are coated by anti-reflection coatings 152, 154. This may actually have the effect of reducing the otherwise stringent requirements for high quality anti-reflection coatings.

To enhance tunability of the external cavity laser it is generally desirable to suppress the longitudinal modes 10-16 generated by the semiconductor laser. A loss margin analysis for the external cavity laser configurations of FIGS. 3A-C, indicates that the ring configuration of FIG. 3C best accomplishes this suppression. With modes 10-16 suppressed, only modes 52-64 need be considered in analyzing the optical oscillator characteristics.

In the loss margin analysis, the round trip loss of the gain chip internal cavity is compared to that of the feedback external cavity for the three feedback configurations of FIGS. 3A-C. The round trip loss of a laser cavity is:

$$\alpha l - \ln(r_1 r_2)$$

where $\alpha l$ is the internal loss within the chip internal cavity and $r_1$ and $r_2$ are the mirror reflectivities. Assuming the ($\alpha l$) of the internal cavities are the same for all three configurations, then a loss difference comparison of the gain chip internal cavity and the feedback external cavity in one round trip of light, results in a difference of logarithms. This difference of logarithms can also be expressed as a logarithm of a ratio, and is so shown in the second column of Table I below.

In the configurations illustrated in FIGS. 3A-C, a number of components are shown and a number of assumptions regarding these components are made. Each configuration includes a semiconductor laser, two AOTFs, one or more collimating lenses, and one or more reflective mirrors. In the 1-sided linear configuration of FIG. 3A, since light exits and enters the semiconductor laser through only one facet, only that facet has an antireflective coating. In addition, only one collimating lens and one reflective mirror is needed. In both the two-sided linear configuration of FIG. 3B and the ring configuration of FIG. 3C, since light exits or enters through both facets, both facets have antireflective coatings and associated collimating lenses. The 2-sided linear configuration further requires two reflective mirrors and the ring configuration, although shown in FIG. 3C with four reflective mirrors, requires at least three reflective mirrors.

Included in the analysis are a coupling factor for the amplifier, $C_a$, coupling factor for the filter, $C_f$, transmission factor for each AOTF, t, reflectivity factor for each reflecting mirror, $r_m$, reflectivity factor for each antireflective coating, $r_c$, and reflectivity factor for the non-coated facet of the l-loss difference comparisons, the following parameter values are assumed:

$$r_m^2 = 1.0$$
$$r_c^2 = 10^{-3}$$
$$c_a^2 = 0.5$$
$$c_f^2 = 1.0$$
$$t^2 = 0.8$$

Since the loss differences are expressed in terms of differential loss, the total loss difference in dB is then calculated and shown in the third column of Table I as the exponent of (10.0 × differential loss difference). From these calculations, it is shown in Table I that the ring configuration has a much higher loss difference with which to discriminate against the solitary chip cavity, as compared to the 1-sided linear cavity configuration, and a significantly higher loss difference, as compared to the 2-sided linear cavity configuration.

TABLE I

| Cavity Type | Loss Margin Analysis Loss Difference | (dB) |
|---|---|---|
| 1-Sided linear (FIG. 3A) | $-\ln(r_c/(c_a^2 c_f^2 t^4 r_m))$ | 23.1 |
| 2-Sided linear (FIG. 3B) | $-2\ln(r_c/(c_a^2 c_f^2 r_m))$ | 50.8 |
| Ring (FIG. 3C) | $-\ln(r_c^2/(c_a^2 c_f^2 r_m^4))$ | 59.8 |

Figure 4:
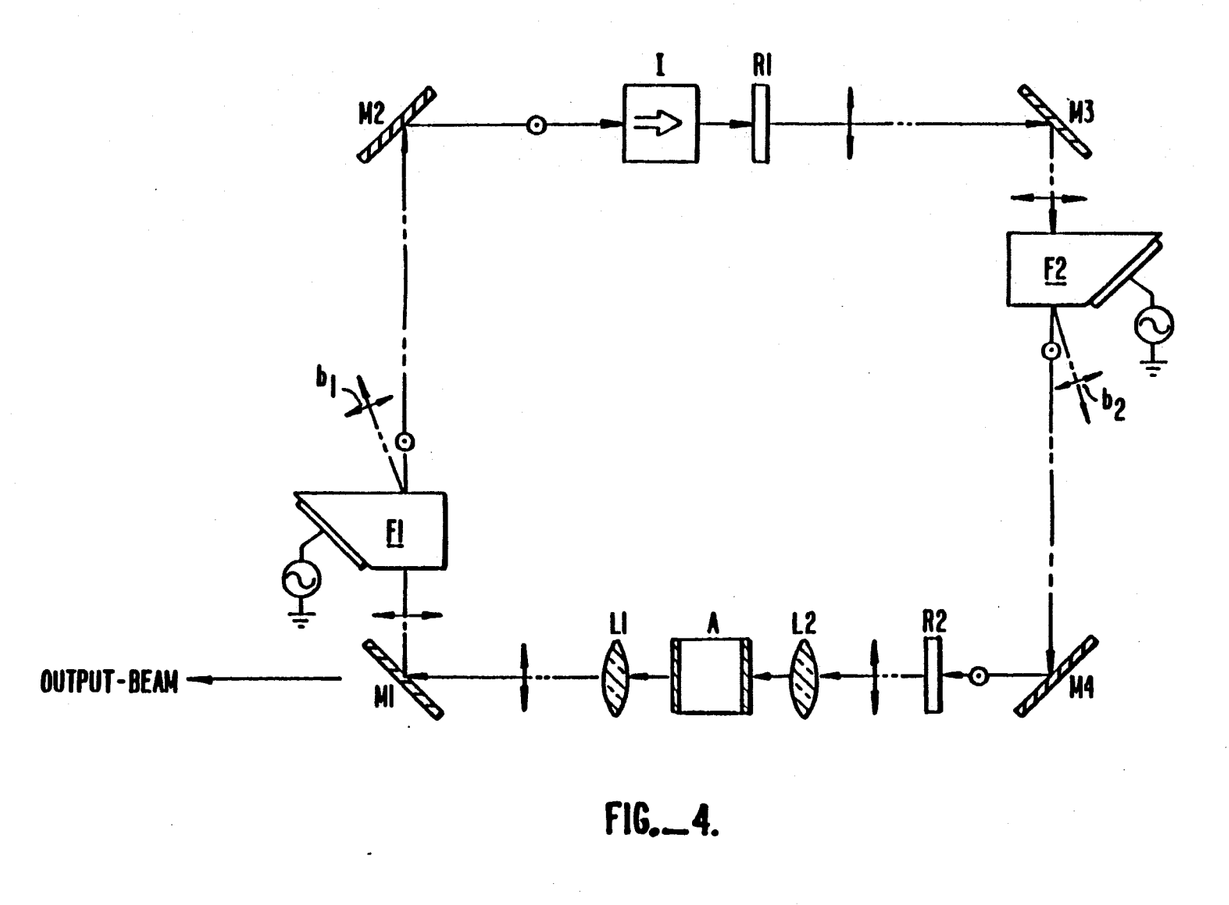
FIG. 4 is a schematic diagram of a twin-AOTF, ring-ECL employing an optical isolator and two half-wave retardation plates to illustrate aspects of the invention.
Figure 5:
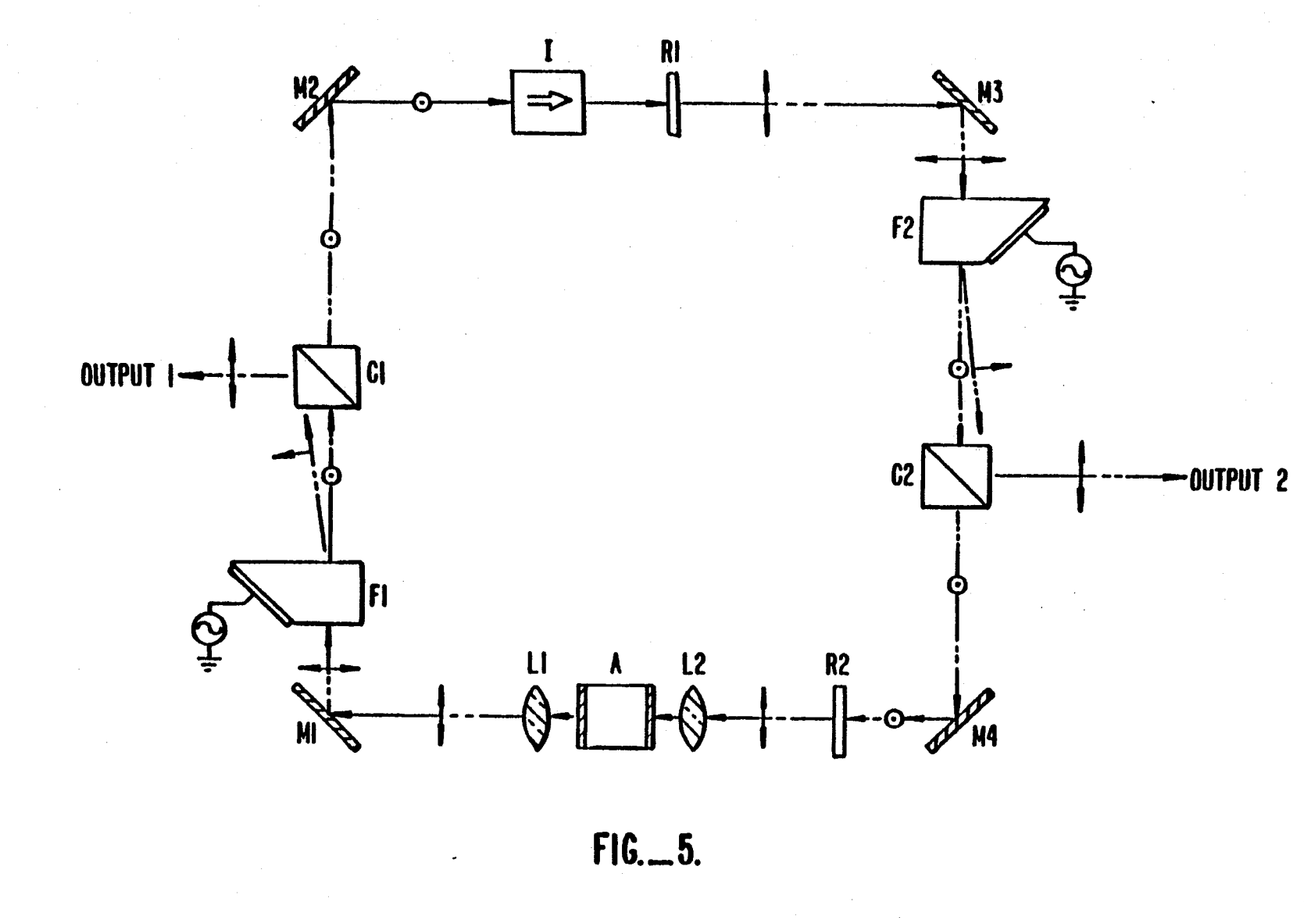
FIG. 5 is a schematic diagram of a twin-AOTF, ring-ECL employing an optical isolator, two half-wave retardation plates and two beam splitters to illustrate aspects of the invention.
Figure 6:
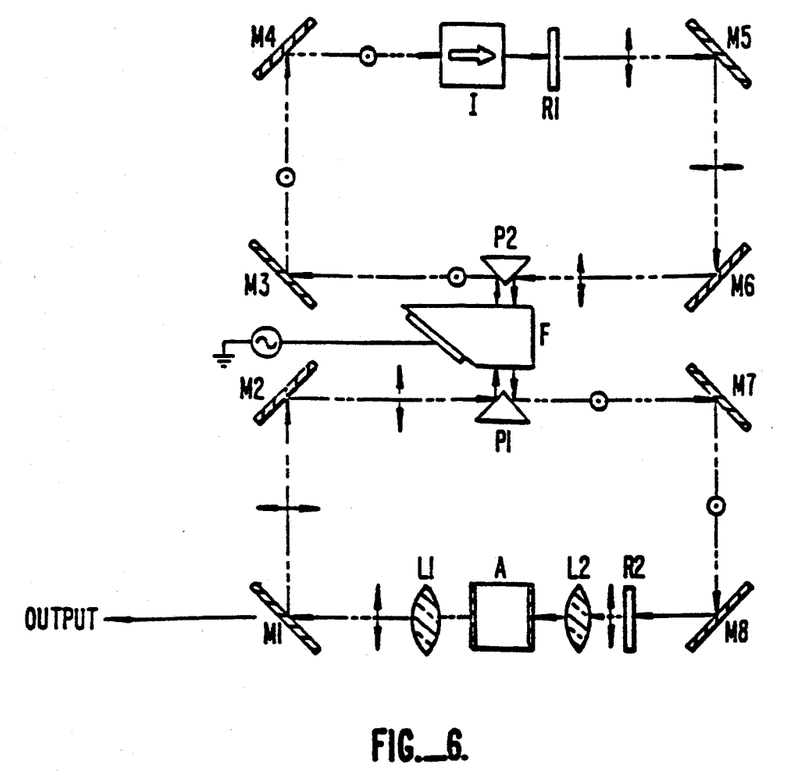
FIG. 6 is a schematic diagram of a single-AOTF, double-passed ring-ECL employing an optical isolator and two half-wave retardation plates to illustrate aspects of the invention.

FIG. 4, 5 and 6 show alternative embodiments of external-ring-configuration lasers. A basic ring configuration is shown in FIG. 4. The AOTF-based ring ECL in FIG. 4 contains 2 filters oriented in such a way so there is no net chirp in one round trip of the cavity. The two filters use the same input polarization to take advantage of the beam steering reduction afforded for one input polarization when the input/output faces of the AOTF are wedge shaped. In this way beam steering can be minimized in a planar ring using a single AOTF crystal shape. The configuration uses an isolator, I, to force unidirectional traveling wave operation, and two one-half wave retardation plates. Plate R1 is to compensate for the polarization rotation caused by I (45° for single stage; 90° for two-stage) so that the second AOTF, F2, receives the same input polarization as the first AOTF, F1. Wave plate R2 rotates the polarization of the filtered output of F2 back to the high gain polarization of the amplifier chip, A, which has an antireflective coating on both facets. Collimating lenses, $L_1$ and $L_2$, are used to focus the light from and to A, and high reflectivity mirrors, M1, M2 and M3, are used to reflect the light around the ring feedback path. The output of the ring laser is then taken through a partially transmitting mirror, M1. The unconverted output beams, $b_1$ and $b_2$, are not utilized in this configuration.

A variation of the twin-AOTF ring ECL is shown in FIG. 5. This configuration utilizes the unconverted filter outputs (shown in FIG. 4 as $b_1$ and $b_2$) as additional laser outputs, extracting them with polarization cube beam-splitters, C1 and C2. This variation may be advantageous if the AOTFs, F1 and F2, have low efficiency.

Another ring ECL configuration is shown in FIG. 6. This configuration is unique in that chirp compensation is achieved with a single AOTF, F. This is not possible in a retroreflecting linear configuration. The configuration uses a single-AOTF ring in which the filter, F, is double passed, producing chirp compensation on each pass. Prisms, P1 and P2, direct the light to and from F.

As shown, the ring configuration discriminates more strongly against solitary chip cavity modes than a linear configuration. The ability to make the ring oscillate unidirectionally using an internal optical isolator may improve the single longitudinal mode stability due to the elimination of spatial hole burning in the gain medium. Further, the ring configuration allows a single filter to be used in a double-pass arrangement, thereby, self-compensating the chirp on each round trip. This is not possible in a retroreflecting linear configuration unless two filter devices are used.

Figure 7:
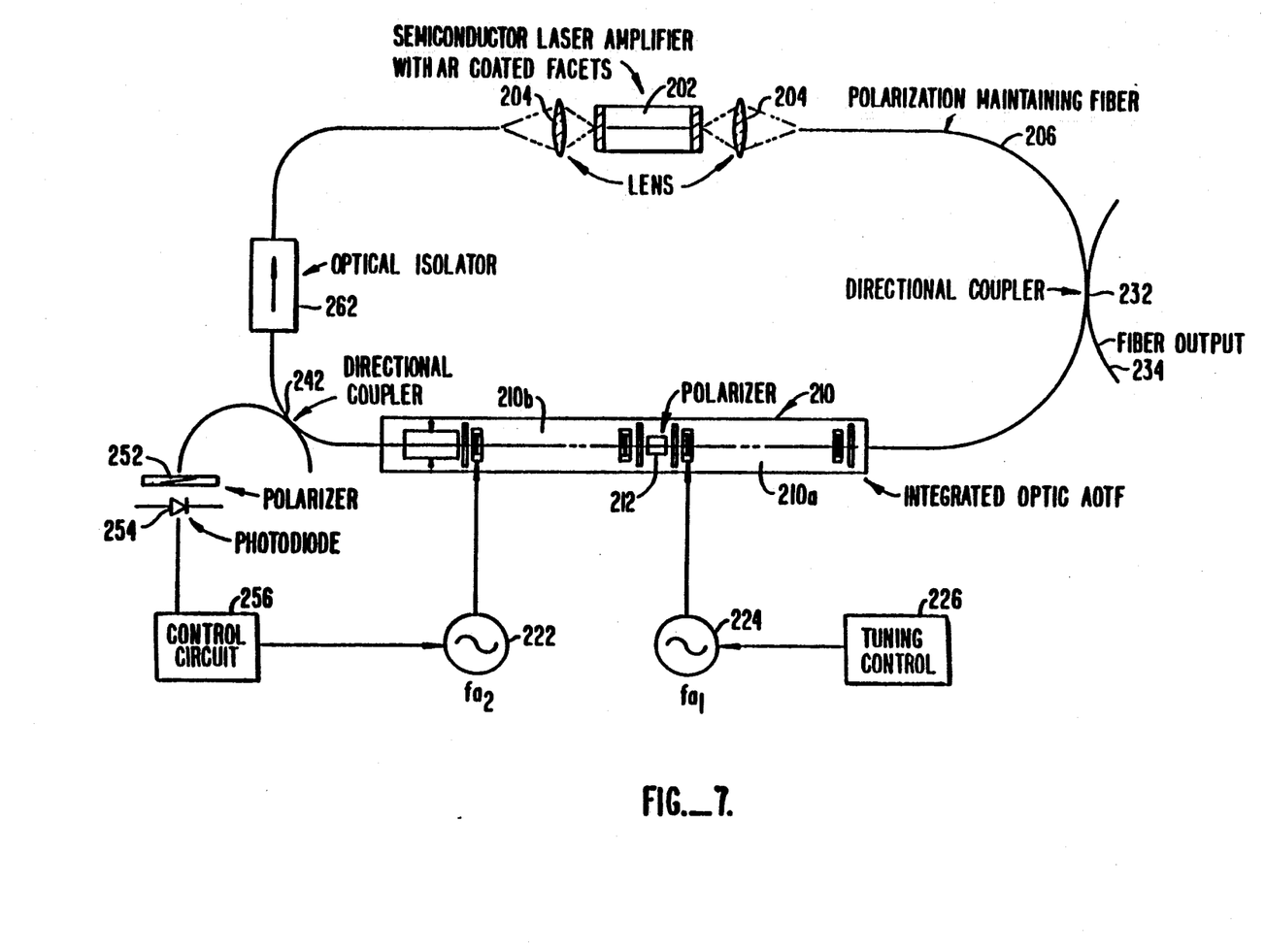
FIG. 7 is a schematic diagram of an optical oscillator sweeper illustrating the preferred embodiment of the invention.

FIG. 7 is a schematic diagram of an optical oscillator sweeper illustrating the preferred embodiment of the invention. As shown in FIG. 7, sweeper 200 includes laser 202, both ends of which have anti-reflection coatings, lenses 204, polarization maintaining (feedback) fiber 206, an integrated optic filter 210 containing two AOTFs 210a, 210b, a polarizer 212, and two electronic drivers 222, 224. Driver 224 is controlled by tuning control 226. A directional coupler 232 couples fiber 206 to an output 234. Another directional coupler 242 couples fiber 206 to a feedback control path including polarizer 252, photodiode 254, and control circuit 256 which controls driver 222. Laser 202 transmits light of a particular linear polarization to fiber 206 where such light is converted by the first AOTF 210a to the orthogonal polarization. Such converted light is filtered by polarizer 212 and converted back to the original polarization by the second AOTF 210b and passed through an optical isolator 262 before it is fed back to laser 202 to induce further light emission within the filter bandwidth. A portion of the light in fiber 206 is also coupled by coupler 242 through a feedback control path. Polarizer 252 may be used to detect either the magnitude of light in the original polarization emitted by laser 202, or alternatively, the magnitude of the light of orthogonal polarization. The magnitude of such light is detected by photodiode 254 where such magnitude is used by control circuit 256 to control the frequency $f_{a2}$ of driver 222.

The sweeper of FIG. 7 is therefore implemented in the ring configuration using optical fibers instead of mirrors as in FIG. 3C. The optical isolator 262 forces unidirectional oscillation of the ring which results in light output from only one of the two directional coupler output ports at 234. While both AOTFs are shown in series on the same substrate, it will be understood that they can be on separate substrates connected with a fiber.

In order to tune the laser to a specific wavelength, a computer or manual control is used to tune $f_{a2}$ using the relationship of equation 4. This sets the center frequency of the acoustooptic filter to the desired laser wavelength. Driver 222 is then used to tune the lasing cavity mode to the center frequency of the acoustooptic filter. If the optical frequency is too high, then $f_{a1}$ is tuned so that it is less than $f_{a2}$, which causes the optical frequency to tune to a low frequency at a rate given by equation 7. If the optical frequency is too low, then $f_{1a}$ is tuned to be greater than $f_{a2}$. In practice, it is desirable to control driver 222 by means of an automatic feedback control loop as shown in FIG. 7. When the optical signal is centered within the AOTF filter bandpass, the light in the filtered polarization is maximized and the light in the orthogonal polarization is minimized. The optical signal from diode 254 is converted to an electrical signal. Polarizer 252 may be used to select one or both of the optical polarizations. One method of control is to tune $f_{a1}$ until the filtered polarization signal is maximized. A standard dither control circuit will be used.

Figure 8:
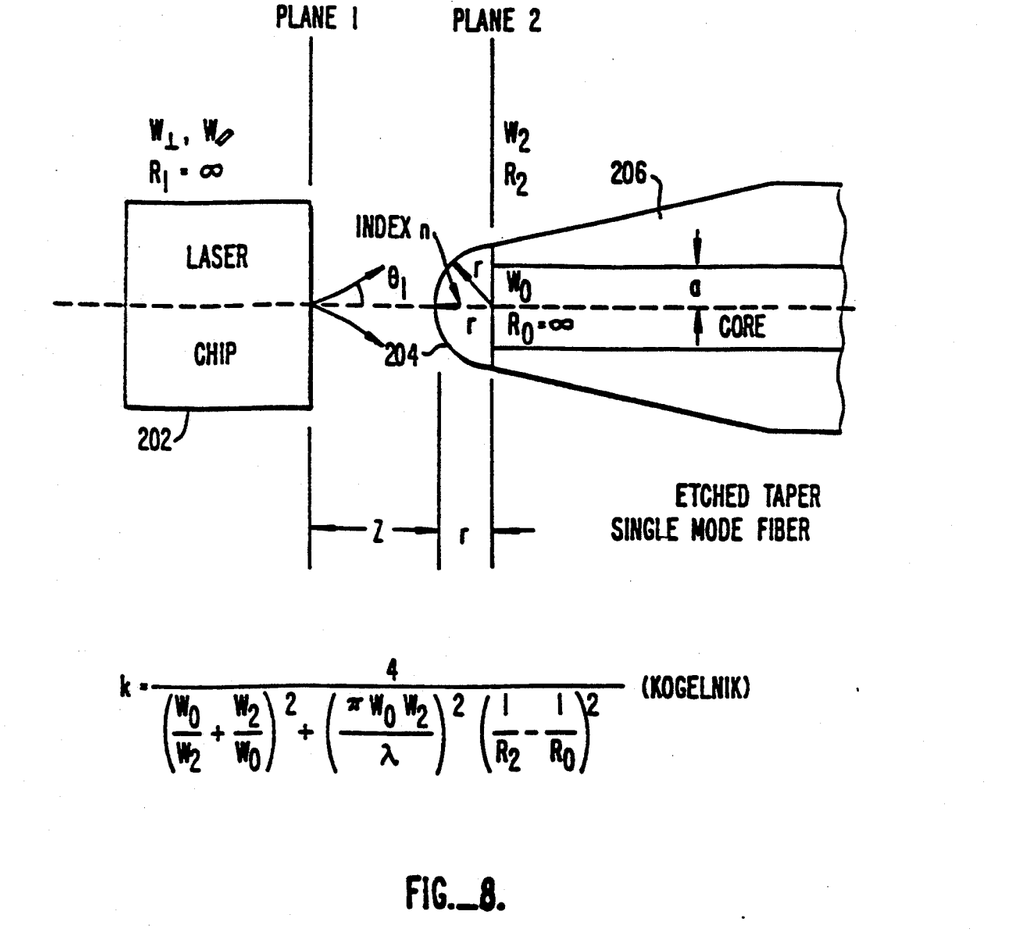
FIG. 8 is a partially schematic and partially cross-sectional view of a portion of the system of FIG. 7 to illustrate the preferred embodiment of the invention.

FIG. 8 is a partially schematic and partially cross-sectional view of a portion of the system of FIG. 7 to illustrate the preferred embodiment of the invention. For simplicity, identical components are identified by the same numerals in the same figures. Thus to simplify the construction of system 200, lenses 204 may simply be formed by a round portion of the ends of fiber 206.

The invention has been described by reference to the preferred embodiment and other specific illustrations. It will be understood that various modifications may be made without departing from the scope of the invention which is to be limited only by the appended claims.

What is claimed is:

1. An electrically-tunable external-cavity laser comprising:
    an optical amplifier having first and second opposing non-reflective end surfaces;
    feedback means defining an external feedback path between the end surfaces, the amplifier and the feedback means together forming an external-cavity laser operable over a predetermined frequency band;
    an acoustooptical tunable filter located in the feedback path and responsive to a tuning signal to tune the external-cavity laser to a desired frequency in said frequency band; and
    a plurality of polarizing elements in the feedback path, at least one polarizing element located on each side of the acoustooptical filter, operative to prevent chirping during operation of the laser.

2. A laser as in claim 1, wherein the amplifier comprises a semiconductor amplifier.

3. A laser as in claim 1 and further comprising an optical isolator located in the feedback path and operative to attenuate any light propagating from the second surface toward the first.

4. A laser as in claim 1 and further comprising a second acoustooptical filter substantially identical to the first, said acoustooptical tunable filters arranged in the feedback path such that any frequency shift created by the first acoustooptical tunable filter is cancelled by the second acoustooptical tunable filter.

5. A laser as in claim 1, wherein the feedback means is configured such that the light signal passes twice through the acoustooptical tunable filter in a single transit from the first end surface to the second, the light signal entering one side of the acoustooptical tunable filter in the first pass and entering the opposite side in the second pass.

* * * * *

UNITED STATES PATENT AND TRADEMARK OFFICE
CERTIFICATE OF CORRECTION

PATENT NO.  : 5,263,037
DATED       : November 16, 1993
INVENTOR(S) : Paul Zorabedian It is certified that error appears in the above-identified patent and that said Letters Patent is hereby corrected as shown below:

On the title page: Item[75] Inventors

Delete the name of William R. Trutna as an inventor of this patent.

Item [19] should read --Zarabedian --.

Signed and Sealed this

Eighteenth Day of October, 1994

Attest:

BRUCE LEHMAN

*Attesting Officer*  *Commissioner of Patents and Trademarks*